United States Patent [19]

Broderick et al.

[11] 3,978,343
[45] Aug. 31, 1976

[54] OPTICALLY COUPLED ISOLATOR CIRCUIT HAVING INCREASED COMMON MODE REJECTION

[75] Inventors: James L. Broderick, San Jose; William R. Fowler, Sunnyvale, both of Calif.

[73] Assignee: National Semiconductor Corporation, Santa Clara, Calif.

[22] Filed: June 30, 1975

[21] Appl. No.: 591,360

[52] U.S. Cl. .................................. 250/551; 357/19
[51] Int. Cl.² ......................................... G02B 27/00
[58] Field of Search .................. 250/551, 238, 210; 307/311; 357/19, 32

[56] References Cited
UNITED STATES PATENTS

| | | | |
|---|---|---|---|
| 3,045,125 | 7/1962 | Mason | 250/238 |
| 3,179,805 | 4/1965 | Astheimer | 250/210 |
| 3,436,548 | 4/1969 | Biard et al. | 357/19 |

*Primary Examiner*—David C. Nelms
*Attorney, Agent, or Firm*—Lowhurst & Aine

[57] ABSTRACT

In a common package, a light emitter, which is responsive to an input signal, produces an output optical signal which is coupled through an optically transmissive electrical insulator to a principal photodetector disposed in stray capacitive coupled relation to the light emitter for detecting the optical signal to produce an output signal in response thereto. A dummy photodetector, which has similar electrical characteristics to that of the principal photodetector except that it is rendered nonresponsive to the output optical signal is similarly coupled in stray capacitive relation to the light emitter to derive a dummy output signal. The dummy signal together with the principal output signal are fed to the differential input terminals of a differential amplifier which takes the difference of the two signals, thereby cancelling common mode signal components capacitively coupled to said photodetector and producing an amplified output signal.

13 Claims, 4 Drawing Figures

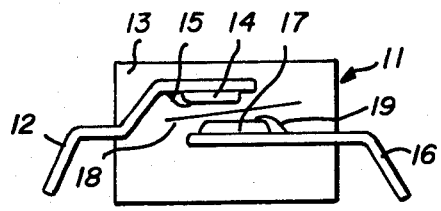
Fig_1
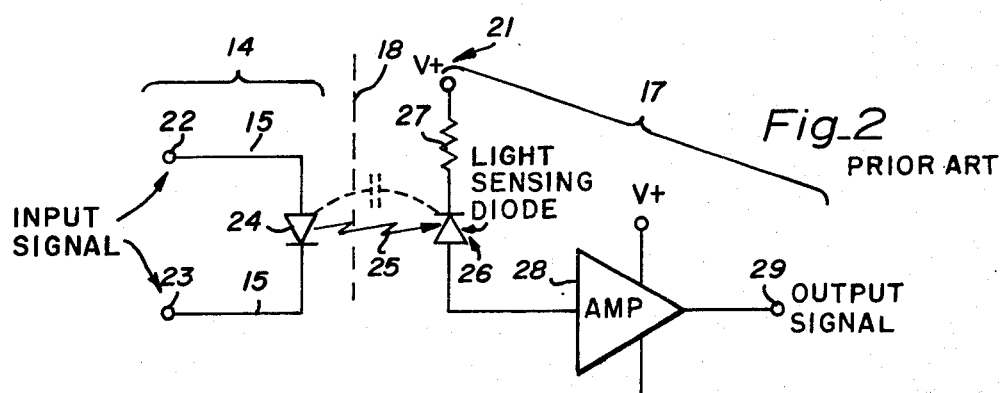
Fig_2 PRIOR ART
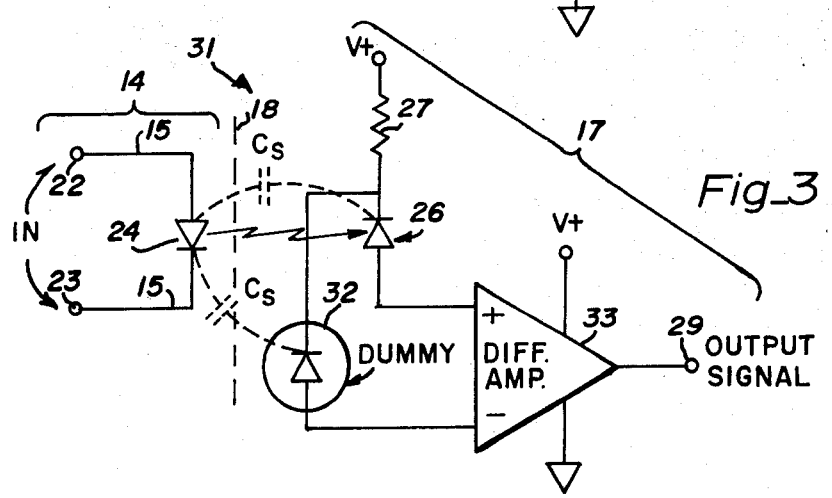
Fig_3
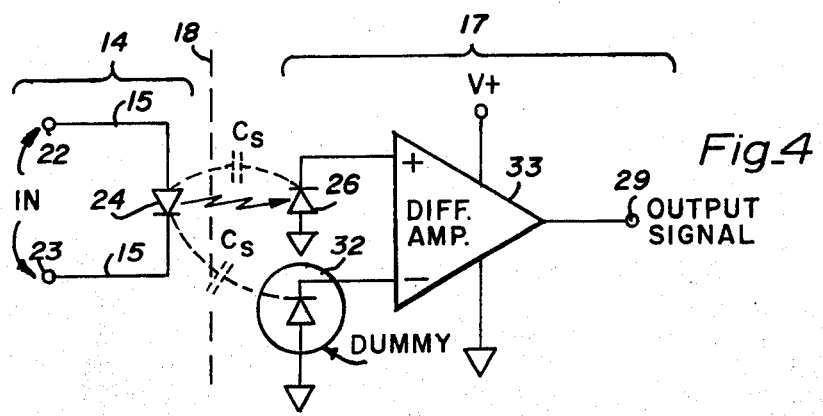
Fig_4

OPTICALLY COUPLED ISOLATOR CIRCUIT HAVING INCREASED COMMON MODE REJECTION

BACKGROUND OF THE INVENTION

The present invention relates in general to optically coupled isolator circuits for electrically isolating the input from the output.

DESCRIPTION OF THE PRIOR ART

Heretofore, semiconductor integrated circuits, as housed in a dual in-line package, have included optically coupled isolators for electrically isolating the input of the dual in-line package from the output so that the input circuit may float electrically relative to the output circuit and so that relatively small signals may be derived from input circuits having relatively high common mode voltages superimposed thereon. More particularly, such optically coupled isolator circuits have included, within a dual in-line integrated semiconductor circuit package, a light emitting diode affixed to one lead frame and being connected to produce an output beam of light in response to an input signal applied across the input terminals to the light emitting diode. A light sensing diode, such as a PIN diode, was disposed within the package and coupled to an opposed lead frame structure in mutually opposed relation to the light emitting diode for receiving the light beam emanating from the diode. An electrically insulative light transmissive insulator sheet was interposed between the light emitting diode and the light sensing diode to insulate the input circuit from the output circuit against relatively high voltage DC or low frequency voltages applied in common to the input terminals. In a typical example, the electrically insulative sheet permits stand-off of common mode low frequency and DC voltages up to 2500 volts.

One of the problems encountered in the prior art optically coupled isolator circuits of the aforementioned type is that higher frequency common mode components which are present on both terminals of the input circuit are capacitively coupled via the stray capacitance between the light emitting diode and the light sensing diode into the electrical circuit of the light sensing diode to be coupled through the electrical circuit and into the output signal.

Therefore it is desirable to provide an improved optically coupled isolator circuit for use within integrated circuit packages which provides increased common mode rejection, i.e., rejection of common mode signals present on the input terminals.

SUMMARY OF THE PRESENT INVENTION

The principal object of the present invention is the provision of an improved optically coupled isolator circuit having increased common mode rejection.

In one feature of the present invention, a dummy photodetector is capacitively coupled to the input light emitting device via a stray capacitance approximating the stray capacitance between the light emitting device and the principal photodetector. The outputs of the two photodetectors are subtracted to derive a difference output free of capacitively coupled common mode components and other spurious signal components.

In another feature of the present invention the principal photodetector and the dummy photodetector comprise light sensing diodes, such diodes having their anodes grounded.

Other features and advantages of the present invention will become apparent upon a perusal of the following specification taken in connection with the accompanying drawings wherein:

BRIEF DESCRIPTION OF THE DRAWINGS

FIG. 1 is a schematic transverse sectional view of a dual in-line package containing the optically coupled isolator circuit of the present invention, FIG. 2 is a schematic circuit diagram of a prior art optically coupled isolator circuit, FIG. 3 is a schematic circuit diagram of an optically coupled isolator circuit incorporating features of the present invention, and FIG. 4 is a schematic circuit diagram, similar to that of FIG. 3, depicting an alternative embodiment of the present invention.

DESCRIPTION OF THE PREFERRED EMBODIMENTS

Referring now to FIG. 1 there is shown a dual in-line integrated semiconductor circuit package 11 incorporating an optically coupled isolator circuit of the present invention. More particularly, the dual in-line package 11 is of the conventional type having a first lead frame structure 12 extending through the wall of an electrically insulative potting material 13 forming the housing of the package. A light emitting diode 14 is affixed to the underside of the input lead frame 12 and electrical connection is made to the light emitting diode via leads 15. The other lead frame structure 16 is similarly potted into the insulative housing 13 from the opposite side. The second lead frame 16 extends into the package in vertically opposed relation to the first lead frame structure 12.

A photodetector and integrated circuit differential amplifier 17, to be more fully described with regard to FIGS. 3 and 4, is affixed, as by bonding, to the upper side of the lead frame 16 in mutually opposed relation to the light emitting diode 14. An electrically insulative sheet 18 of a material which is light transmissive at the wavelength of the optical output signal derived from the light emitting diode 14 is interposed between the light emitting diode 14 and the integrated circuit 17 to permit substantial low frequency and DC voltages to be established between the respective devices 14 and 17, thereby electrically isolating the input circuit from the output circuit. The integrated circuit device 17 is electrically connected to the lead frame structure 16 via a plurality of wire bonding leads 19.

Referring now to FIG. 2 there is shown the prior art optically coupled isolator circuit 21. Circuit 21 includes an input circuit having a pair of input terminals 22 and 23 for applying an input signal across a light emitting diode 24 to cause an output optical signal 25 to be generated in response to input signals applied across the light emitting diode 24. A light sensing diode 26 is disposed in the path of the optical radiation 25 on the opposite side of the insulative sheet 18 for receiving the optical radiation and producing an output signal in response thereto. The light sensing diode 26 is reverse biased by means of a potential $V_+$ derived from a power supply and supplied via a load resistor 27. The output electrical signal, derived from the light sensing diode 26, is fed into an amplifier 28 for amplification to produce an output signal on output terminal 29.

The problem with the prior art circuit of FIG. 2 is that there is a stray capacitance $C_s$ established between the light emitting diode 24 and the light sensing diode 26 in the package 11. As a consequence of this stray capacitance, the common mode signals, i.e., electrical signals established on the input terminals 22 and 23 which are of the same phase and magnitude are capacitively coupled via the stray capacitance into the circuit of the light sensing diode and appear as a component of the output signal derived via detection of light passing from the light emitting diode to the light sensing diode.

In addition, another problem with the prior art circuit of FIG. 2 is that power supply fluctuations on power supply $V_+$ and which are applied to the light sensing diode 26 appear in the output signal of the light sensing diode 26 as spurious signal components. Furthermore, certain temperature dependent spurious leakage current components appear in the output of the light sensing diode 26.

In a typical example of a prior art circuit 21 of FIG. 2, common mode signals at relatively high frequencies as of greater than 500 kilohertz are coupled via the stray capacitance through the circuit. More particularly, in a typical example the isolation between the input circuit and the output circuit is approximately 2500 volts at DC. However, at one megahertz the isolation has dropped from 2500 volts to 20 volts peak-to-peak.

Referring now to FIG. 3 there is shown the optically coupled isolator circuit 31 of the present invention. Circuit 31 is similar to that of FIG. 2 with the exception that a dummy light sensing diode 32 has been connected to the power supply in parallel with the primary light sensing diode 26. In addition, the outputs of the primary and dummy light sensing diodes 26 and 32 are fed into the differential input terminals of a differential amplifier 33 which subtracts the output signal derived from the primary light sensing diode 26 from the output of the dummy diode 32 to derive an amplified difference output signal appearing on output terminal 29. The primary light sensing diode 26 and the dummy light sensing diode 32 are arranged relative to the light emitting diode 24 to provide substantially equal values of stray capacitance $C_s$ to the light emitting diode 24. The stray capacitive signals which are coupled into the outputs of the primary and dummy diodes 26 and 32 are substantially equal so that they are cancelled in the differential amplifier 33 to produce an output signal which is substantially free of such capacitively coupled signals. Accordingly, the common mode rejection of the optically coupled isolator circuit 31 is substantially increased over the prior art.

Furthermore, the provision of the dummy light sensing diode 32 further improves the performance of the device since the power supply fluctuations which produce spurious components in the output signals from the light sensing diodes 26 and 32 are similarly cancelled in the differential amplifier 33. Furthermore, temperature dependent leakage current effects that produce spurious components in the output of the light sensing diodes 26 and 32 similarly cancel in the differential amplifier 33.

In a typical example of the circuit of FIG. 3, the light emitting diode 24 comprises a GaAsP light emitting diode emitting in the red band of a wavelength of 6600 angstroms. A suitable light emitting diode comprises, for example, the National Semiconductor Model 0071 LED chip. The light sensing diodes 26 and 32 comprise integrated circuit light sensing diodes comprising reverse biased PN junctions. In the case of the dummy light sensing diode 32, the diode is merely covered over with an opaque material such as black epoxy resin. The diodes 26 and 32 are arranged in the package so as to provide substantially equal stray capacitive coupling to the input light emitting diode 24.

Referring now to FIG. 4 there is shown an alternative embodiment of the optically coupled isolator circuit of the present invention. In the circuit 35 of FIG. 4, the apparatus is substantially the same as that of FIG. 3 with the exception that the anodes of the respective light sensing diodes 26 and 32 are grounded. This particular configuration further enhances the common mode rejection.

What is claimed is:

1. The method for increasing the common mode rejection between the input and output of an optically coupled isolator circuit of the type wherein, in a common package, a light emitter means which is responsive to an input signal produces an output optical signal which is coupled through an optically transmissive electrical insulator to a principal photodetector disposed in stray capacitive coupled relation to said light emitter means for detecting the optical signal to produce an output signal in response thereto, the steps of:

coupling a dummy photodetector, which has similar electrical characteristics to said principal photodetector means except being nonresponsive to the output optical signal, in stray capacitive coupled relation to said light emitter means, such stray capacitive coupling being similar in phase and magnitude to the stray capacitive coupling between said principal photodetector and said light emitter, to derive a dummy output electrical signal from said dummy photodetector which is nearly the same as that derived from said first photodetector except for the detected optical signal component in the output of said principal photodetector; and taking the difference between said dummy output signal and said output signal from said principal photodetector to derive a difference signal output having increased common mode rejection.

2. The method of claim 1 wherein said photodetectors are photodetector diodes and including the step of, grounding the anodes of both of said dummy and principal photodetector diodes.

3. The method of claim 1 wherein the step of taking the difference between said dummy output signal and said output signal from said principal photodetector includes, feeding the output signals from said photodetectors into the respective differential input terminals of a differential amplifier to derive the difference output signals.

4. In an optically coupled isolator circuit of the type wherein, in a common package, a light emitter means is responsive to an input signal to produce an output optical signal which is coupled through an optically transmissive electrical insulator to a photodetector means disposed in stray capacitive coupled relation to said light emitter means for detecting the optical signal to produce an output signal in response thereto:

dummy photodetector means having electrical characteristics similar to those of said first photodetector means except said dummy photodetector means being nonresponsive to the output optical signal, said dummy photodetector means being coupled in stray capacitive relation to said light emitter means, such stray capacitive coupling being similar in phase and magnitude to the stray capacitive coupling between said first photodetector and said light emitter means to derive a dummy output electrical signal from said dummy photodetector means which is nearly the same in phase and magnitude as the output electrical signal derived from said first photodetector except for the detected optical signal component in the output electrical signal of said first photodetector; and means for taking the difference between said dummy output electrical signal and said output signal derived from said first photodetector means to derive a difference output electrical signal having increased common mode rejection.

5. The apparatus of claim 4 wherein both of said first and dummy photodetector means comprise a reverse biased PN junction of a light sensing diode.

6. The apparatus of claim 5 wherein the anodes of both of said reverse biased light sensing diodes are connected to ground.

7. The apparatus of claim 4 wherein said means for taking the difference between said dummy output signal and said output signal from said first photodetector includes, differential amplifier means having the output signal of said dummy photodetector means coupled to one differential input of said differential amplifier and the electrical output signal derived from said first photodetector means being coupled into the other differential input of said differential amplifier.

8. In an optically coupled electrically isolated circuit disposed in a common integrated semiconductive circuit package:

input circuit means for producing output optical radiation in response to an input applied thereto;

photodetector means disposed in stray capacitively coupled relation and in optically coupled relation with said input circuit means to receive and to detect said output optical radiation to produce an output electrical signal in response to the received and detected optical radiation such output electrical signal having spurious stray capacitively coupled electrical components therein due to said stray capacitive coupling between said input circuit and said photodetector means;

electrical insulator means disposed between said input circuit means and said photodetector means for electrically isolating said photodetector means from said input circuit means for DC potentials established therebetween;

said photodetector means including first and second photodetectors coupled via stray capacitance to said input circuit to produce first and second stray capacitively coupled signal components in the output signal derived therefrom, one of said photodetectors being responsive to said output optical radiation to produce an electrical signal having said stray capacitive coupled components therein and said other photodetector means being nonresponsive to said optical radiation to produce an output electrical signal including therein said stray capacitively coupled electrical components; and means for subtracting the output electrical signal of one of said photodetector means from the output electrical signal of said other photodetector means to derive a difference signal wherein the optical signal component is preserved therein and wherein said stray capacitively coupled components are substantially cancelled therein.

9. The apparatus of claim 8 wherein said input circuit includes a light emitting diode means for producing said output optical radiation in response to an electrical input signal applied thereto.

10. The apparatus of claim 9 wherein said first and second photodetectors comprise first and second light sensing diodes respectively.

11. The apparatus of claim 10 wherein said insulator means includes an optically transparent sheet of electrically insulative material interposed between said light emitting diode means and said first and second light sensing diodes.

12. The apparatus of claim 10 wherein said optically nonresponsive light sensing diode is coated with a material which is optically opaque at the wavelength of the optical radiation emitted by said light emitting diode.

13. The apparatus of claim 8 wherein said subtracting means includes a differential amplifier means having a pair of input terminals for receiving respective output electrical signals derived from said photodetector means to produce said difference signal as an output thereof.

* * * * *